US010431939B2

(12) United States Patent
Oporta et al.

(10) Patent No.: US 10,431,939 B2
(45) Date of Patent: Oct. 1, 2019

(54) OVER-VOLTAGE PROTECTION SYSTEMS AND METHODS

(71) Applicant: QUALCOMM Incorporated, San Diego, CA (US)

(72) Inventors: Hector Ivan Oporta, San Jose, CA (US); Shashank Prakash Mane, San Jose, CA (US); Thomas O'Brien, Powell, OH (US); Christian Gregory Sporck, Campbell, CA (US)

(73) Assignee: QUALCOMM Incorporated, San Diego, CA (US)

( * ) Notice: Subject to any disclaimer, the term of this patent is extended or adjusted under 35 U.S.C. 154(b) by 284 days.

(21) Appl. No.: 15/494,934

(22) Filed: Apr. 24, 2017

(65) Prior Publication Data

US 2017/0346240 A1 Nov. 30, 2017

Related U.S. Application Data

(60) Provisional application No. 62/341,705, filed on May 26, 2016, provisional application No. 62/478,784, filed on Mar. 30, 2017.

(51) Int. Cl.
*H01R 13/66* (2006.01)
*G05F 3/02* (2006.01)
(Continued)

(52) U.S. Cl.
CPC ........... *H01R 13/6666* (2013.01); *G05F 3/02* (2013.01); *G06F 13/385* (2013.01);
(Continued)

(58) Field of Classification Search
USPC .......................................... 361/56, 91.1, 111
See application file for complete search history.

(56) References Cited

U.S. PATENT DOCUMENTS 7,809,864 B1 10/2010 Young et al.
8,729,950 B2 5/2014 Gagne et al.
(Continued)

OTHER PUBLICATIONS

International Preliminary Report on Patentability for PCT/US2017/029419, dated Jul. 16, 2018, 23 pages.
(Continued)

*Primary Examiner* — Danny Nguyen
(74) *Attorney, Agent, or Firm* — Withrow & Terranova, PLLC (57) ABSTRACT

Over-voltage protection systems and methods are disclosed. In one aspect, a biasing circuit is added to a pre-existing clamp required by the Universal Serial Bus (USB) Type-C specification at a configuration control (CC) pin. The biasing circuit turns the pre-existing clamp into an adjustable clamp that dynamically adjusts to over-voltage conditions. In an exemplary aspect, the biasing circuit may include a biasing field effect transistor (FET) and a pair of switches that selectively couple the pre-existing clamp and the biasing FET to fixed voltages such that the CC pin is maintained at an acceptable voltage. In another exemplary aspect, the biasing circuit may omit the biasing FET and rely on two switches that selectively couple the pre-existing clamp to fixed voltages such that the CC pin is maintained at an acceptable voltage.

24 Claims, 9 Drawing Sheets

(51) Int. Cl.
  *G06F 13/40* (2006.01)
  *H03K 19/003* (2006.01)
  *H03K 19/0185* (2006.01)
  *G06F 13/38* (2006.01)
  *G06F 13/42* (2006.01)
  *H01L 27/02* (2006.01)
  *H01L 27/06* (2006.01)
  *H01R 24/60* (2011.01)
  *H05K 9/00* (2006.01)
  *H02H 9/04* (2006.01)
  *H01R 107/00* (2006.01)

(52) U.S. Cl.
  CPC ...... *G06F 13/4022* (2013.01); *G06F 13/4282* (2013.01); *H01L 27/0248* (2013.01); *H01L 27/0629* (2013.01); *H01R 24/60* (2013.01); *H03K 19/00315* (2013.01); *H03K 19/0185* (2013.01); *H01R 2107/00* (2013.01); *H02H 9/041* (2013.01); *H02H 9/046* (2013.01); *H05K 9/0067* (2013.01)

(56) References Cited

U.S. PATENT DOCUMENTS

| 8,873,213 | B2 | 10/2014 | Zhan et al. |
| 9,219,473 | B2 | 12/2015 | Dreps |
| 9,780,783 | B1* | 10/2017 | Srivastava ......... H03K 19/0005 |
| 2012/0182662 | A1 | 7/2012 | Hsueh |
| 2014/0268463 | A1* | 9/2014 | Dreps ................... H03K 17/04 |
| | | | 361/91.1 |
| 2015/0268688 | A1 | 9/2015 | Leinonen et al. |
| 2015/0293514 | A1 | 10/2015 | Tupala |
| 2017/0093154 | A1* | 3/2017 | Geng ..................... H02M 7/04 |

OTHER PUBLICATIONS

Author Unkown, "AN-6102: USB Type C, CC Pin Protection," Fairchild Semiconductor Corporation, Revision 1.0, Nov. 13, 2015, 3 pages.
Co-pending U.S. Appl. No. 15/072,784, filed Mar. 17, 2016.
International Search Report and Written Opinion for PCT/US2017/029419, dated Aug. 8, 2017, 17 pages.
Second Written Opinion for PCT/US2017/029419, dated May 4, 2018, 12 pages.

* cited by examiner

OVER-VOLTAGE PROTECTION SYSTEMS AND METHODS

PRIORITY APPLICATIONS

The present application claims priority to U.S. Provisional Patent Application Ser. No. 62/341,705, filed May 26, 2016 and entitled "OVER-VOLTAGE PROTECTION SYSTEMS AND METHODS," the contents of which is incorporated herein by reference in its entirety.

The present application also claims priority to U.S. Provisional Patent Application Ser. No. 62/478,784 filed on Mar. 30, 2017 and entitled "OVER-VOLTAGE PROTECTION SYSTEMS AND METHODS," the contents of which is incorporated herein by reference in its entirety.

BACKGROUND

I. Field of the Disclosure

The technology of the disclosure relates generally to preventing damage to circuitry associated with a cable receptacle pin in an over-voltage condition.

II. Background

Computing devices have become common throughout modern society. These devices offer an ever increasing array of functions and capabilities that were little imagined when the first computers were introduced. After a period of heterogeneous proprietary computing platforms, the industry has realized that a more common platform offers greater commercial opportunity. To this end, the industry has converged on a relatively small number of operating systems and architectures.

As the number and types of computing devices have increased, so have the number and types of peripheral devices increased, including cameras, memory sticks, music players, and the like. These peripherals also saw an initial surge in heterogeneous proprietary connectors and cables through which such peripherals would communicate with other computing devices, but recent trends have moved towards a general convergence of the types of connectors and protocols that are used to allow communication between a host computing device and a peripheral. One common protocol is the Universal Serial Bus (USB) protocol, which has standardized a number of different connector types that allow a single protocol to be used. Recently, the USB standards setting body has announced a Type-C connector. However, there are many existing legacy devices which still have a Type-A connector. It is expected that a large number of Type-A to Type-C cables will be made and sold to allow such legacy devices to communicate with newer devices having a Type-C connection.

The circuitry associated with the pins of the Type-C connector is generally fairly sensitive and may be damaged if high voltages pass through the pin. The USB Type-C specification requires that the voltage at the configuration channel (CC) pin not exceed five volts (5 V). However, there are situations where as much as twenty-eight volts (28 V) may be applied to the pin. Most such over-voltage conditions arise when a Type-A to Type-C cable is being used. One solution is to provide an external circuit including a Zener diode that clamps the voltage at the CC pin to the requisite 5 V. While effective, this approach may increase cost and complexity as the external element must be located proximate the connector. Still further, such a Zener diode solution may have excessive leakage current which may interfere with some operation modes. Accordingly, there is a need to provide a better over-voltage protection option for devices that may use a Type-A to Type-C cable.

SUMMARY OF THE DISCLOSURE

Aspects disclosed in the detailed description include over-voltage protection systems and methods. In particular, exemplary aspects of the present disclosure add a biasing circuit to a pre-existing clamp required by the Universal Serial Bus (USB) Type-C specification at a configuration control (CC) pin. The biasing circuit turns the pre-existing clamp into an adjustable clamp that dynamically adjusts to over-voltage conditions. In an exemplary aspect, the biasing circuit may include a biasing field effect transistor (FET) and a pair of switches that selectively couple the pre-existing clamp and the biasing FET to fixed voltages such that the CC pin is maintained at an acceptable voltage. In another exemplary aspect, the biasing circuit may omit the biasing FET and rely on two switches that selectively couple the pre-existing clamp to fixed voltages such that the CC pin is maintained at an acceptable voltage. Still other biasing circuits may be used. The biasing circuits of the present disclosure are relatively small and cost effective to implement. Further, the biasing circuits do not require external components. Still further, if a PMOS biasing FET is used, there is no leakage current to interfere with any operational modes.

In this regard in one aspect, a device is disclosed. The device includes a USB receptacle configured to receive a USB cable. The USB receptacle includes a CC pin. The device also includes a first FET. The first FET includes a first source, a first drain, and a first gate. The first source is coupled to the CC pin and the first drain is coupled to ground. The device also includes a second FET. The second FET includes a second source, a second drain, and a second gate. The second gate is coupled to the first gate and to the second drain at a communal node. The device also includes a first switch coupled to the second source and selectively coupling the second source to an internal voltage source (Vaa). The device also includes a second switch coupled to the communal node and selectively coupling the communal node to an external voltage source (Vconn). In a first mode of operation, both the first switch and the second switch are open and the CC pin is clamped at a first Vgs above ground. In a second mode of operation, only one of the first switch and the second switch is open, and the CC pin is clamped at a corresponding first voltage or second voltage.

In another aspect, a device is disclosed. The device includes a USB receptacle configured to receive a USB cable. The USB receptacle includes a CC pin. The device also includes a first means for clamping coupled to the CC pin and coupled to ground. The device also includes a second means for clamping FET coupled to the first means for clamping and to a communal node. The device also includes a first switch coupled to the second means for clamping FET and selectively coupling the second means for clamping FET to an internal voltage source (Vaa). The device also includes a second switch coupled to the communal node and selectively coupling the communal node to an external voltage source (Vconn). In a first mode of operation, both the first switch and the second switch are open and the CC pin is clamped at a first Vgs above ground. In a second mode of operation, only one of the first switch and the second switch is open, and the CC pin is clamped at a corresponding first voltage or second voltage.

In another aspect, a method for protecting a pin on a USB connector is disclosed. The method includes providing biasing circuitry on a FET associated with a pin on a USB connector. The method also includes clamping the pin at a first voltage if power is applied to a chip associated with the pin. The method also includes clamping the pin at one of a second voltage or a third voltage if power is not applied.

In another aspect, a device is disclosed. The device includes a USB receptacle configured to receive a connector of a USB cable. The USB receptacle includes a CC pin. The device also includes a first FET including a first source, a first drain, and a first gate. The first source is coupled to the CC pin, and the first drain is coupled to ground. The device also includes a first switch coupled to the first gate and selectively coupling the first gate to an internal voltage source (Vaa). The device also includes a second switch coupled to the first gate and selectively coupling the first gate to an external voltage source (Vconn). In a first mode of operation, both the first switch and the second switch are open and the CC pin is claimed at a first Vgs above ground. In a second mode of operation, only one of the first switch and the second switch is open and the CC pin is clamped at a corresponding first voltage or second voltage.

In another aspect, a device is disclosed. The device includes a USB receptacle configured to receive a USB cable. The USB receptacle includes a CC pin. The device also includes a first FET including a first source, a first drain, and a first gate. The first source is coupled to the CC pin, and the first drain is coupled to ground. The device also includes biasing circuitry coupled to the first gate and selectively coupled to a first voltage source and a second voltage source. In a first mode of operation, the biasing circuitry causes the first FET to be clamped at the first voltage source. In a second mode of operation, the biasing circuitry causes the first FET to be clamped at the second voltage source.

In another aspect, a device is disclosed. The device includes a USB receptacle configured to receive a connector of a USB cable. The USB receptacle includes a CC pin. The device also includes a first NMOS FET including a first source, a first drain, and a first gate. The first drain is coupled to the CC pin, and the first source is coupled to ground. The device also includes a first switch coupled to the first gate and selectively coupling the first gate to the CC pin. The device also includes a second switch coupled to the first gate and selectively coupling the first gate to ground. The device also includes a pull-up resistor coupled to the CC pin. The device also includes a third switch coupled between ground and the pull-up resistor. In a first mode of operation, both the first switch and the second switch are open, and the CC pin is clamped by the first NMOS FET. In a second mode of operation, the first, second, and third switches create a voltage divider to clamp the CC pin.

In another aspect, a device is disclosed. The device includes a USB receptacle configured to receive a connector of a USB cable. The USB receptacle includes a CC pin. The device also includes a first NMOS FET including a first source, a first drain, and a first gate. The first drain is coupled to the CC pin, and the first source is coupled to ground. The device also includes a first switch coupled to the first gate and selectively coupling the first gate to the CC pin. The device also includes a second switch coupled to the first gate and selectively coupling the first gate to ground. The device also includes a second NMOS FET coupled to the CC pin. In a first mode of operation, both the first switch and the second switch are open, and the CC pin is clamped by the first NMOS FET. In a second mode of operation, the second NMOS FET protects the CC pin.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include over-voltage protection systems and methods. In particular, exemplary aspects of the present disclosure add a biasing circuit to a pre-existing clamp required by the Universal Serial Bus (USB) Type-C specification at a configuration control (CC) pin. The biasing circuit turns the pre-existing clamp into an adjustable clamp that dynamically adjusts to over-voltage conditions. In an exemplary aspect, the biasing circuit may include a biasing field effect transistor (FET) and a pair of switches that selectively couple the pre-existing clamp and the biasing FET to fixed voltages such that the CC pin is maintained at an acceptable voltage. In another exemplary aspect, the biasing circuit may omit the biasing FET and rely on two switches that selectively couple the pre-existing clamp to fixed voltages such that the CC pin is maintained at an acceptable voltage. Still other biasing circuits may be used. The biasing circuits of the present disclosure are relatively small and cost effective to implement. Further, the biasing circuits do not require external components. Still further, if a PMOS biasing FET is used, there is no leakage current to interfere with any operational modes.

Before addressing the particulars of over-voltage protection systems and methods of the present disclosure, a brief overview of a computing system using a USB cable and a typical USB Type-C connector are discussed with reference to FIGS. 1 through 3. Exemplary aspects of the present disclosure are discussed beginning with FIG. 4 below.

Figure 1:
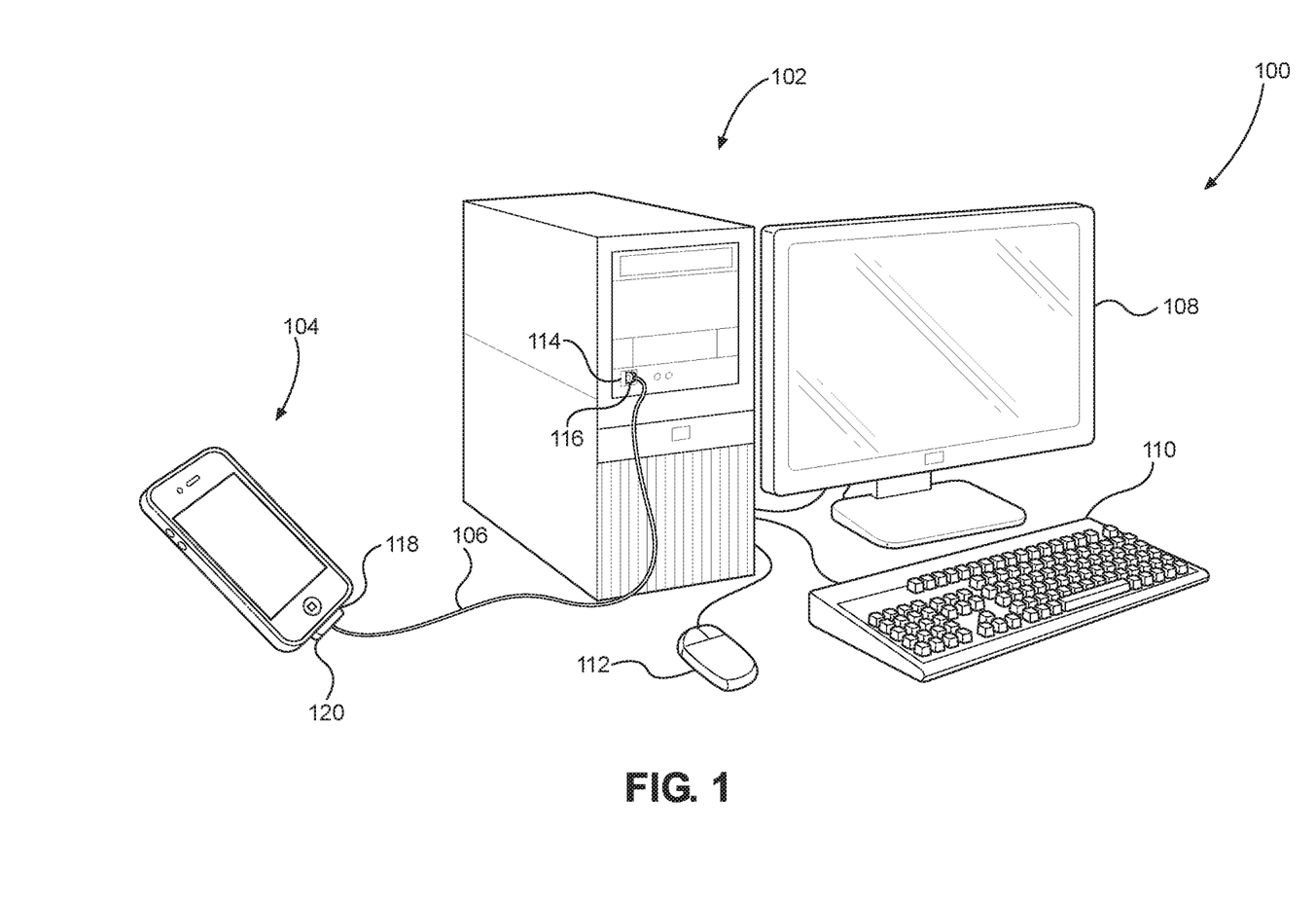
FIG. 1 is a simplified illustration of two computing devices coupled by a Universal Serial Bus (USB) Type-A to Type-C cable that may experience over-voltage situations.

In this regard, FIG. 1 is a computing environment 100 with a first computing device 102 coupled to a second computing device 104 through a USB cable 106. The first computing device 102 may be an older desktop computer having a display 108, a keyboard 110, and a mouse 112. Additionally, the first computing device 102 may include a USB Type-A receptacle or port 114 that couples to a USB Type-A connector 116 on the USB cable 106.

With continued reference to FIG. 1, the second computing device 104 may be a peripheral or mobile terminal such as a smart phone that includes a USB Type-C receptacle or port 118 that couples to a USB Type-C connector 120 on the USB cable 106. Thus, the USB cable 106 is a USB Type-A to Type-C cable. The first computing device 102 may communicate with the second computing device 104 through the USB cable 106 as is well understood.

Figure 2:
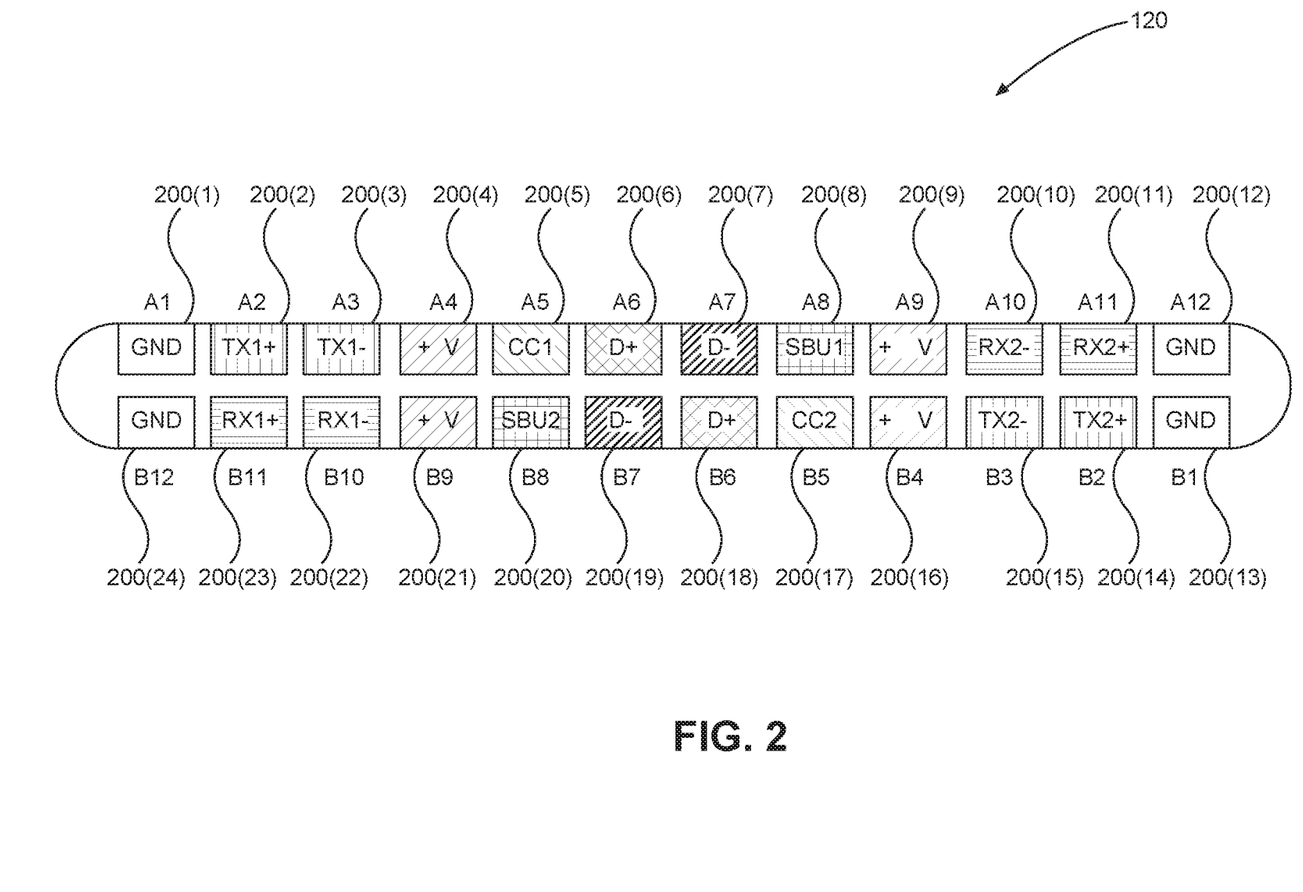
FIG. 2 is a schematic illustration of a USB Type-C connector with pin assignments illustrated.
Figure 3:
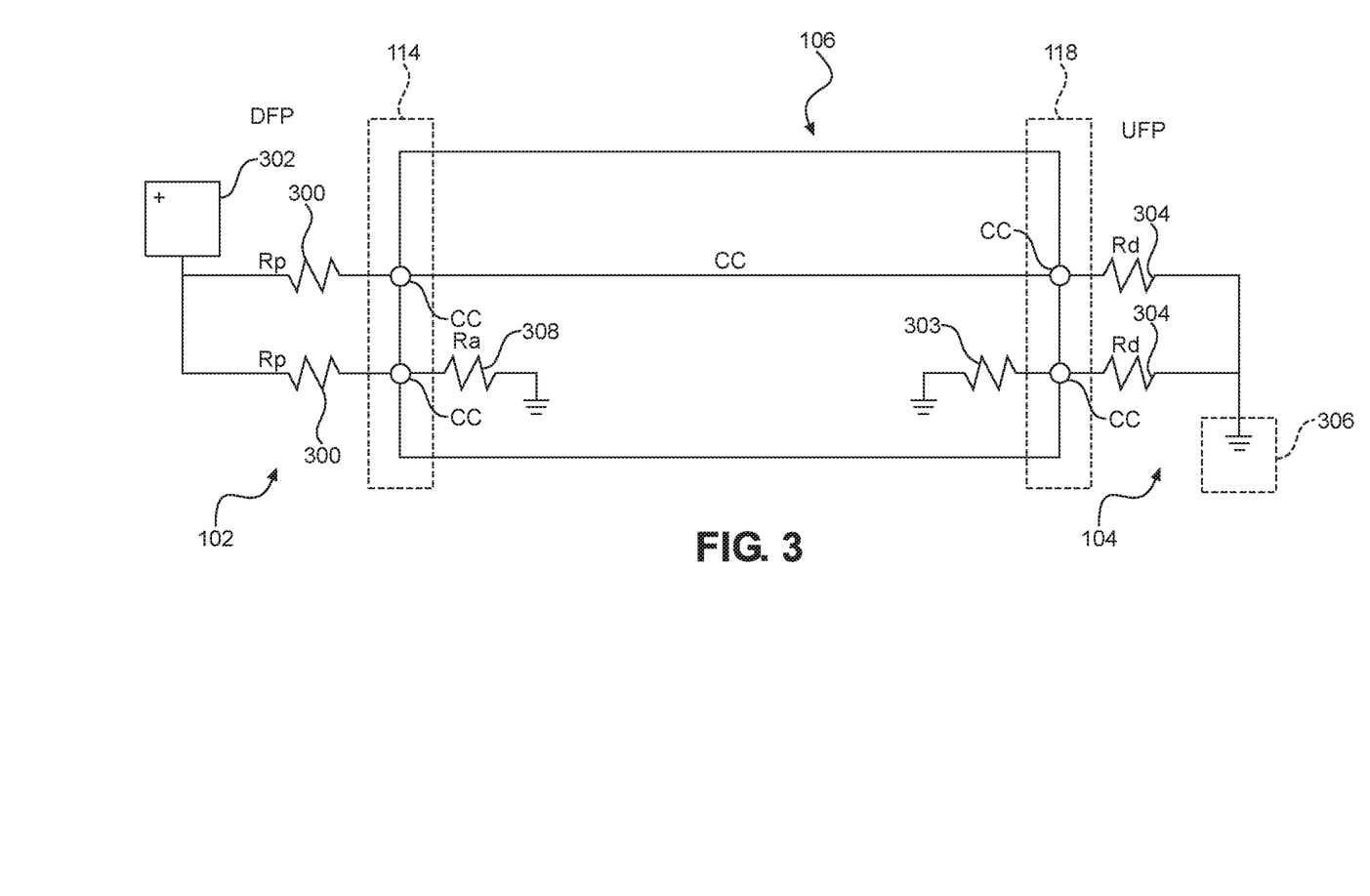
FIG. 3 illustrates pull-up and pull-down resistors used in a USB Type-C system in conjunction with a USB cable.

FIG. 2 illustrates the pin layout for the USB Type-C connector 120. The USB Type-C connector 120 includes twenty-four pins or contacts 200(1)-200(24), which have functions as assigned by the USB Type-C specification and are summarized in Table 1 below.

TABLE 1

USB TYPE-C CONNECTOR PIN CONFIGURATION

| Number | Pin | Name | Description |
| --- | --- | --- | --- |
| 200(1) | A1 | GND | Ground return |
| 200(2) | A2 | SSTXp1 | SuperSpeed differential pair #1, TX, positive |
| 200(3) | A3 | SSTXn1 | SuperSpeed differential pair #1, TX, negative |
| 200(4) | A4 | $V_{BUS}$ | Bus power |
| 200(5) | A5 | CC1 | Configuration Channel |
| 200(6) | A6 | Dp1 | USB 2.0 differential pair, position 1, positive |
| 200(7) | A7 | Dn1 | USB 2.0 differential pair, position 1, negative |
| 200(8) | A8 | SBU1 | Sideband Use (SBU) |
| 200(9) | A9 | $V_{BUS}$ | Bus power |
| 200(10) | A10 | SSRXn2 | SuperSpeed differential pair #2, RX, negative |
| 200(11) | A11 | SSXp2 | SuperSpeed differential pair #2, RX, positive |
| 200(12) | A12 | GND | Ground return |
| 200(13) | B1 | GND | Ground return |
| 200(14) | B2 | SSTXp2 | SuperSpeed differential pair #2, TX, positive |
| 200(15) | B3 | SSTXn2 | SuperSpeed differential pair #2, TX, negative |
| 200(16) | B4 | $V_{BUS}$ | Bus power |
| 200(17) | B5 | CC2 | Configuration Channel |
| 200(18) | B6 | Dp2 | USB 2.0 differential pair, position 2, positive |
| 200(19) | B7 | Dn2 | USB 2.0 differential pair, position 2, negative |
| 200(20) | B8 | SBU2 | Sideband use |
| 200(21) | B9 | $V_{BUS}$ | Bus power |
| 200(22) | B10 | SSRXn1 | SuperSpeed differential pair #1, RX, negative |
| 200(23) | B11 | SSRXp1 | SuperSpeed differential pair #1, RX, positive |
| 200(24) | B12 | GND | Ground return |

It should be appreciated that a USB receptacle or port such as the USB Type-C port 118 has complementary conductive elements. In some exemplary aspects, such conductive elements are pins, and in others, such conductive elements are contact pads. As used herein, the conductive elements of the USB receptacle are referred to as pins regardless of the specific form they take. The form factor of the USB receptacle is defined in the USB specification and well understood at this point.

The USB specification further defines the use of certain resistors and their expected values in conjunction with a USB cable. FIG. 3 illustrates how these resistors are arranged per the USB specification. In particular, the USB specification defines a downstream facing port (DFP), which typically is on a host computer such as the first computing device 102 and an upstream facing port (UFP), which is typically on a peripheral such as the second computing device 104. The DFP (i.e., the first computing device 102) exposes pull-up resistors 300 (also labeled Rp in FIG. 3) which are coupled to a voltage source 302 on the CC pins of the USB Type-A receptacle 114. The UFP exposes pull-down resistors 304 (also labeled Rd in FIG. 3), which are coupled to ground 306. The purpose of the pull-up resistors Rp 300 and the pull-down resistors Rd 304 on the CC pins is to identify the DFP-to-UFP connection and the CC pin that will be used for connection. To do this, the DFP monitors both CC pins for a voltage that is lower than its unterminated voltage. Concurrently, the UFP monitors its respective CC pins for orientation. Concurrent with the exposure of the Rd and Rp terminations, the USB cable 106 exposes a pull-down resistor 308 (also labeled Ra in FIG. 3) on its VCONN pin (discussed in greater detail below) to signal to the DFP that it needs power. The DFP must be able to differentiate between the presence of the pull-down resistors Rd 304 and Ra 308 to know whether there is a UFP attached and where to apply VCONN. The DFP is not required to source VCONN unless the pull-down resistor Ra 308 is detected. Thus, the USB specification defines Ra, Rd, and Rp as well as VCONN.

The USB Type-C specification further requires that CC pins (i.e., first CC pin 200(5) and second CC pin 200(17)) be held at five volts (5 V) to protect the circuitry within a computing device such as the second computing device 104 that is associated with the CC pins. However, there are situations where more than 5 V may be provided through the USB cable 106 from the Type-A end of the USB cable 106. Such high voltages may damage the circuitry within the second computing device 104 associated with the CC pins. Exemplary aspects of the present disclosure provide an elegant solution as described in greater detail below beginning with reference to FIG. 4.

Figure 4:
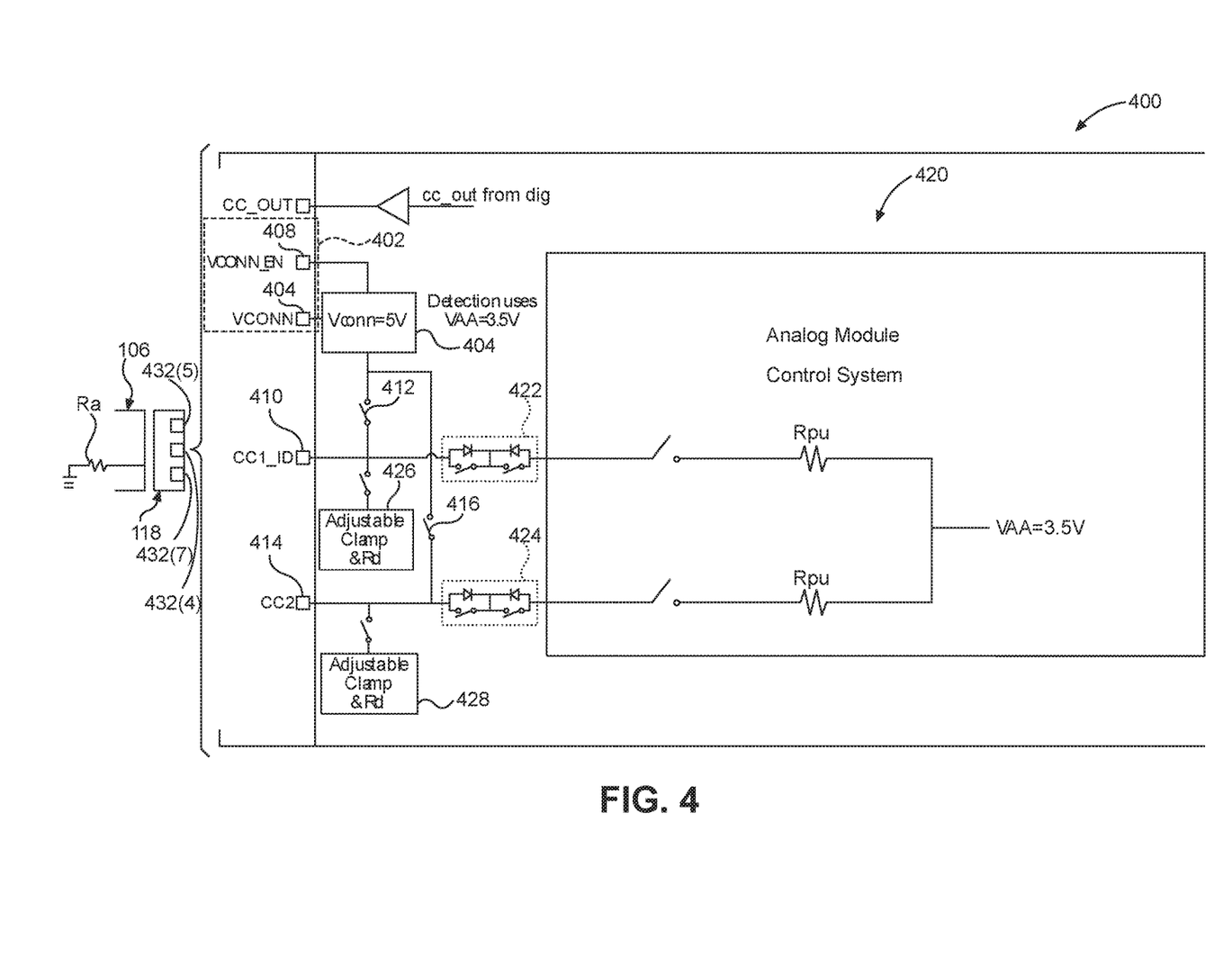
FIG. 4 illustrates a partial block diagram of circuitry associated with a USB Type-C receptacle including an analog module control system.

In this regard, FIG. 4 illustrates a simplified view of circuitry 400 inside the second computing device 104 of FIG. 1. In particular, the circuitry 400 includes an input 402 for an additional voltage source (Vconn) 404, namely, a Vconn pin 406 (also labeled VCONN in FIG. 4) and a Vconn enable pin 408 (also labeled VCONN_EN in FIG. 4). The additional voltage source 404 is sometimes referred to as an external voltage source. In an exemplary aspect Vconn may come from a Vbus pin such as pin 432(4) within the USB Type-C port 118 (illustrated) (or the second Vbus pin corresponding to Vbus pin 200(21), not illustrated) during an on the go (OTG) mode. Vconn may also come from an external 5 V regulator (not illustrated). The additional voltage source 404 is switchably coupled to a first CC node 410 by a first switch 412 and to a second CC node 414 by a second switch 416. The first CC node 410 may be coupled to CC pin 432(5) in the USB Type-C port 118 and is further coupled to an analog module control system 420 through a blocking diode switch system 422. The analog module control system 420 includes or receives power from a voltage source (labeled Vaa, which operates at around 3.5 V). Likewise, the second CC node 414 is coupled to the second CC pin 200(17) in the USB Type-C port 118 and is further coupled to the analog module control system 420 through a second blocking diode switch system 424. The blocking diode switch systems 422 and 424 include two face-to-face diodes and two switches as illustrated. The blocking diode switch systems 422 and 424 may be used to block selectively the higher voltage of Vconn (5 V) from reaching the analog module control system 420 (which normally operates at Vaa). The voltage source Vaa is switchably connected to the blocking diode switch systems 422 and 424 through pull resistors (labeled Rpu). Additionally, a first adjustable clamp circuit 426 is associated with the first CC node 410 and a second adjustable clamp circuit 428 is associated with the second CC node 414. The first adjustable clamp circuit 426 includes biasing circuitry and an associated resistance Rd. Likewise, the second adjustable clamp circuit 428 includes biasing circuitry and an associated resistance Rd. It should be appreciated that the USB cable 106 plugs into the USB Type-C port 118 with the USB Type-C connector 120.

Figure 5:
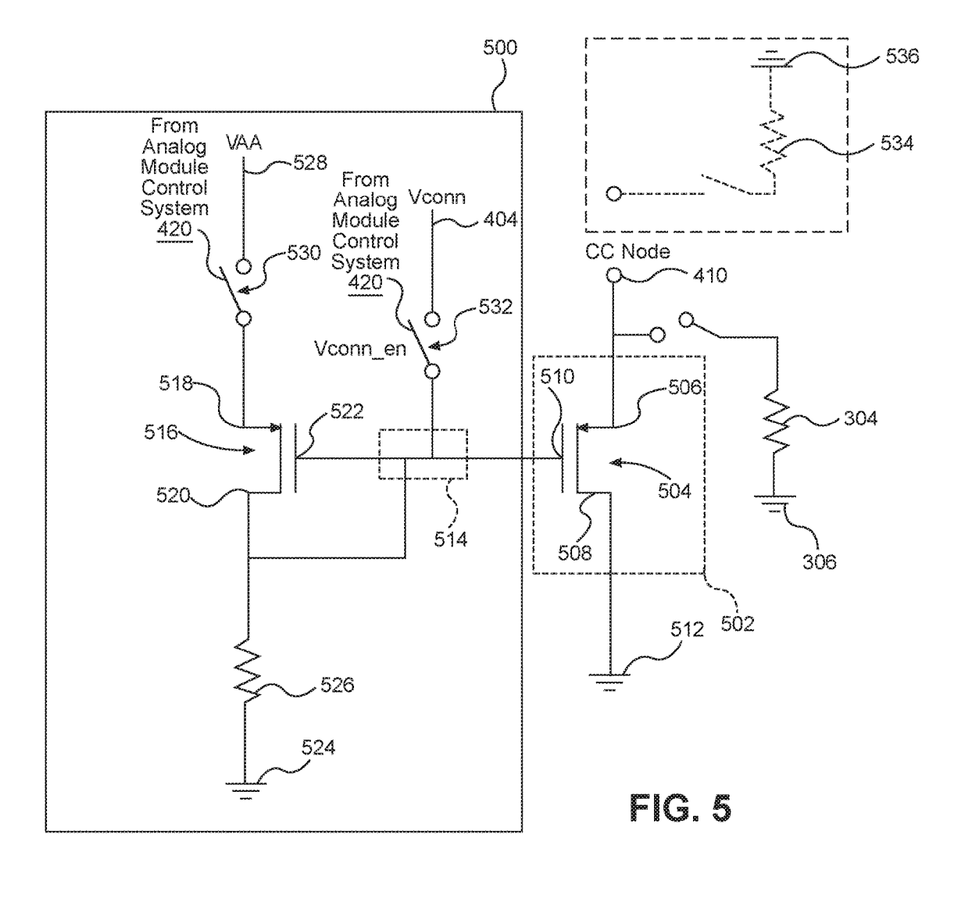
FIG. 5 illustrates a circuit diagram of a biasing circuit for a voltage clamp for a pin in a USB Type-C receptacle.

Additional detail about an exemplary aspect of the first adjustable clamp circuit 426 and the second adjustable clamp circuit 428 with their respective biasing circuitry is provided with reference to FIG. 5. Further exemplary aspects are illustrated below with reference to FIGS. 7-9. Only the first adjustable clamp circuit 426 is illustrated and discussed in FIG. 5 with the understanding that the second adjustable clamp 428 is substantially identical, albeit coupled to a different CC node (i.e. the second CC node 414 instead of the first CC node 410). In this regard, the first adjustable clamp circuit 426 includes a biasing circuitry 500 and a clamp 502. The clamp 502 includes a first FET 504 that includes a first source 506, a first drain 508, and a first gate 510. As illustrated, the first FET 504 may be a PMOS FET and may be sometimes referred to as a first means for clamping. The first drain 508 is coupled to ground 512. The first source 506 is coupled to the first CC node 410. It should be appreciated that the first FET 504 is required by the USB Type-C specification. It is this first FET 504 that actually clamps the first CC node 410 to a desired voltage based on the associated biasing circuitry 500.

Continuing the exemplary aspect of FIG. 5, the first gate 510 is coupled to a communal node 514. The biasing circuitry 500 further includes a second FET 516 that includes a second source 518, a second drain 520, and a second gate 522. In an exemplary aspect, the second FET 516 is also a PMOS FET and may sometimes be referred to as a second means for clamping. The second gate 522 is coupled to the first gate 510 and to the second drain 520 through the communal node 514. The second drain 520 is further coupled to ground 524 through a resistor 526. The ground 524 and the ground 512 may be at the same potential. The second source 518 is switchably coupled to an internal voltage source (VAA) 528 through a first switch 530. The internal voltage source 528 is supplied by an internal low drop out (LDO) regulator and is about 3.5 volts. The communal node 514 is switchably coupled to the external voltage source 404 (referred also as Vconn in FIG. 5) by a second switch 532.

With continued reference to FIG. 5, the first switch 530 and the second switch 532 are controlled by signals from the analog module control system 420 of FIG. 4. In particular, in a first mode of operation, when no power is available to the chip containing the USB physical layer, the analog module control system 420 opens the first switch 530 and the second switch 532. No power in this context means that there is no Vbus signal and there is no battery power present. When both the first switch 530 and the second switch 532 are open, the first CC node 410 is clamped at a voltage Vgs above the ground 512. According to the USB Type-C specification, Vgs is about 1.1 V. This voltage is well within the tolerance of the USB Type-C specification, which requires 5 V or less. As used herein, "about" means within a 20% tolerance. As further used herein, "closely about" means within a 5% tolerance, and "very closely about" means within a 1% tolerance.

With continued reference to FIG. 5, in a second mode of operation, the analog module control system 420 also detects relative resistances associated with the first CC pin 200(5) and the second CC pin 200(17). More details about using the analog module control system 420 to detect resistances can be found in U.S. patent application Ser. No. 15/072,784, filed Mar. 17, 2016 and entitled "TYPE-C FACTORY AND SPECIAL OPERATING MODE SUP-PORT," which is hereby incorporated by reference in its entirety. In particular, the analog module control system 420 is detecting for pull-down resistors Rd and Ra (in the USB cable 106), both of which are defined by the USB Type-C specification. A first pull-down resistor Rd 304 is switchably positioned between the first CC node 410 and the ground 306. A second pull-down resistor Rd 534 is switchably positioned between the first CC node 410 and ground 536 outside the second computing device 104. As discussed above, the pull-down resistors Rd 304 and 534 are only presented by the UFP or whichever device is acting as the UFP. When the second computing device 104 is receiving power, the first pull-down resistor Rd 304 is asserted and the second pull-down resistor Rd 534 is not asserted. When the second computing device 104 is providing power, the first pull-down resistor Rd 304 is not asserted the external second pull-down resistor Rd 534 is asserted. The use and assertion of the pull-down resistors Rd 304 and 534 are according to the USB specification. Each of the pull-down resistors Rd 304 and 534 is typically about 5.1 kΩ and the pull-down resistor Ra is typically about 1 kΩ. If the pull-down resistor Rd is associated with the second CC node 414 and the pull-down resistor Ra is associated with the first CC node 410, the external voltage source 404 is enabled. When the external voltage source 404 is enabled, the first switch 530 is open and the second switch 532 is closed. In this situation, the first CC node 410 is then clamped at the external voltage source 404 plus Vgs. Since the external voltage source 404 is normally 5 V, this means that the first CC node 410 is clamped at around 6.1 V. This effectively disables the clamp 502 on the node that Vconn is powering. Since the clamp 502 is disabled, the 6.1 V does not reach the vulnerable circuitry and the standard is satisfied. If, however, the pull-down resistor Rd is associated with the first CC node 410 and the pull-down resistor Ra is associated with the second CC node 414, the external voltage source 404 is not enabled, and the second switch 532 is open. The first switch 530 is closed in this situation and the clamp reference is set at the internal voltage source 528, or about 3.5 V.

It should be appreciated that use of PMOS FETs for the second FET 516 insures that there is little or no leakage current at the operating ranges. By eliminating leakage current, there should not be any errors in low current sensing or factory mode detection. Further, the biasing circuitry 500 is relatively simple and robust while consuming a relatively small amount of area. Still further, the use of the second FET 516 and the switches 530 and 532 consume relatively little current.

Figure 6:
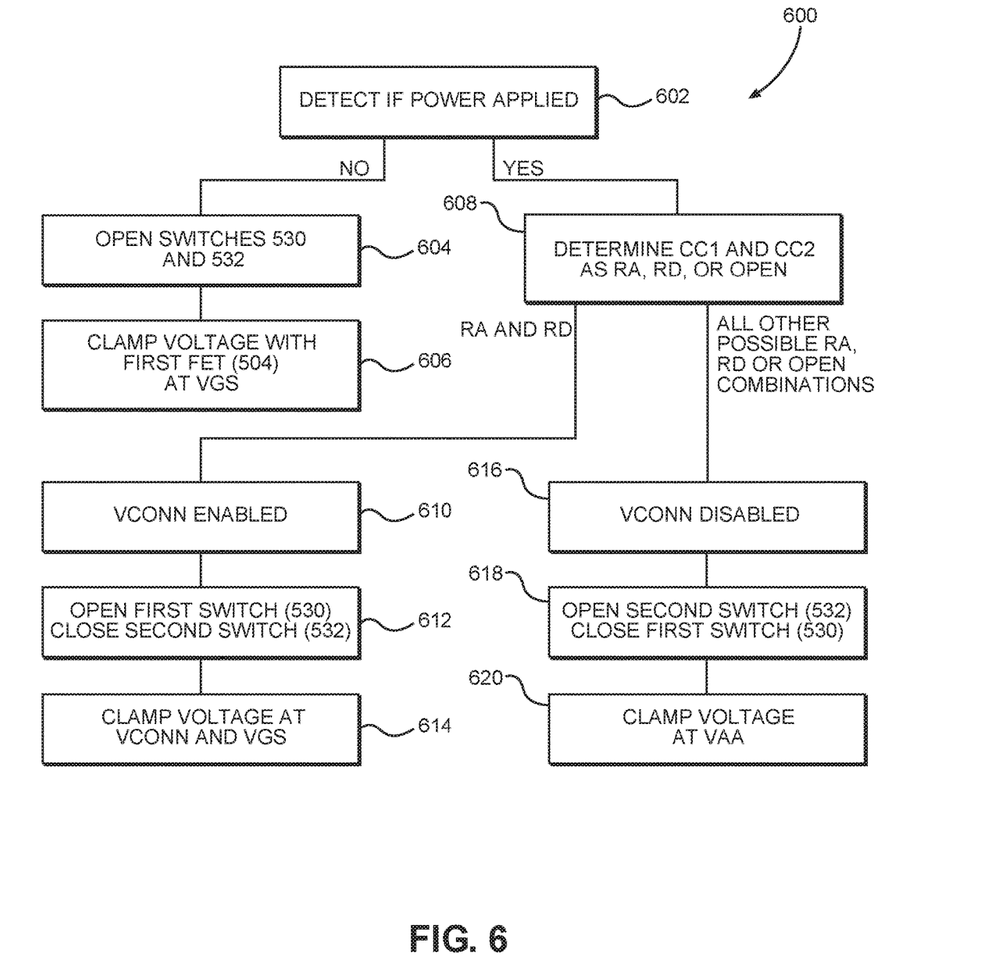
FIG. 6 illustrates a flowchart for circuit control during pin protection during over-voltage conditions.

FIG. 6 provides a flowchart of a process 600 associated with the over-voltage systems described here. The process 600 begins by detecting if power is applied to the chip (block 602). If no power is applied, then the analog module control system 420 opens both the first switch 530 and the second switch 532 (block 604), and the voltage at the first CC node 410 is clamped with the first FET 504 at Vgs (block 606).

With continued reference to FIG. 6, if power is supplied to the chip, then the analog module control system 420 detects if the pull-down resistor Ra or Rd is associated with the first CC node 410 and/or the second CC node 414 or whether the node is open (block 608). If the first CC node 410 and the second CC node 414 collectively have both the pull-down resistor Ra and the pull-down resistor Rd, then the external voltage source 404 is enabled (block 610). Further, the analog module control system 420 opens the first switch 530 and closes the second switch 532 (block 612). This arrangement clamps the voltage at the first CC node 410 at the external voltage source 404 plus Vgs (block 614).

With continued reference to FIG. 6, for all other combinations of Ra, Rd, and open states at the CC nodes 410 and 414, the external voltage source 404 is disabled (block 616), and the analog module control system 420 opens the second switch 532 and closes the first switch 530 (block 618). This arrangement clamps the voltage at the first CC node 410 at the internal voltage source 528 (block 620).

Figure 7:
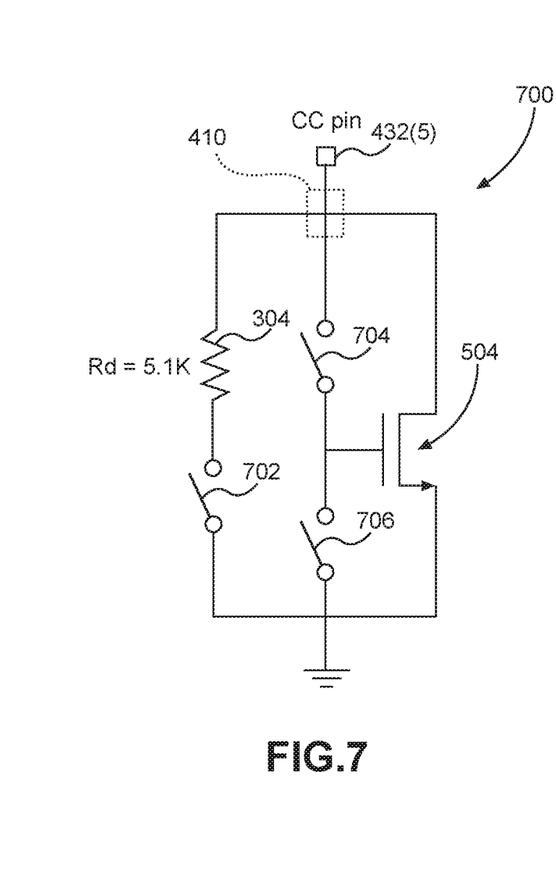
FIG. 7 illustrates a circuit diagram of an alternate solution for pin protection during over-voltage conditions.
Figure 8:
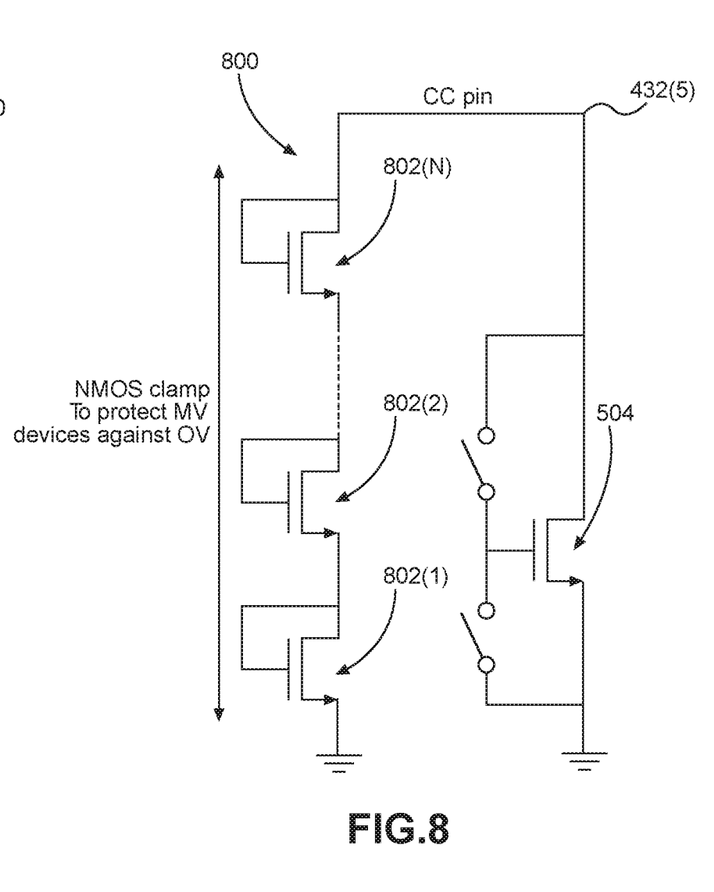
FIG. 8 illustrates a circuit diagram of a second alternate solution for pin protection during over-voltage conditions.

While the present disclosure provides a simple, robust solution to provide over-voltage protection, there are other solutions. As noted, one solution already proposed is to use an external zener diode. FIGS. 7 and 8 provide two other alternate solutions that rely on NMOS FETs. In FIG. 7, biasing circuitry 700 allows the pull-down resistor Rd 304 to be selectively enabled to protect the first CC pin 432(5) by controlling the voltage present at the first CC node 410. Switches 702, 704, and 706 are controlled digitally. The pull-down resistor Rd 304 attempts to protect the CC pin 432(5) by creating a voltage divider with an external pull-up resistor. This biasing circuitry 700 allows the clamping voltage to depend on the over-voltage level being applied and the pull-up resistor value.

In FIG. 8, biasing circuitry 800 is formed from a plurality of NMOS clamps 802(1)-802(N) that are coupled to ground. While more reliable than the arrangement of FIG. 7 because the clamp is always applied and the first CC pin 432(5) is continuously protected, this arrangement suffers from leakage to ground from the plurality of NMOS clamps 802(1)-802(N). This leakage may add error while doing low current sensing such as crude sensing and factory mode detection.

Figure 9:
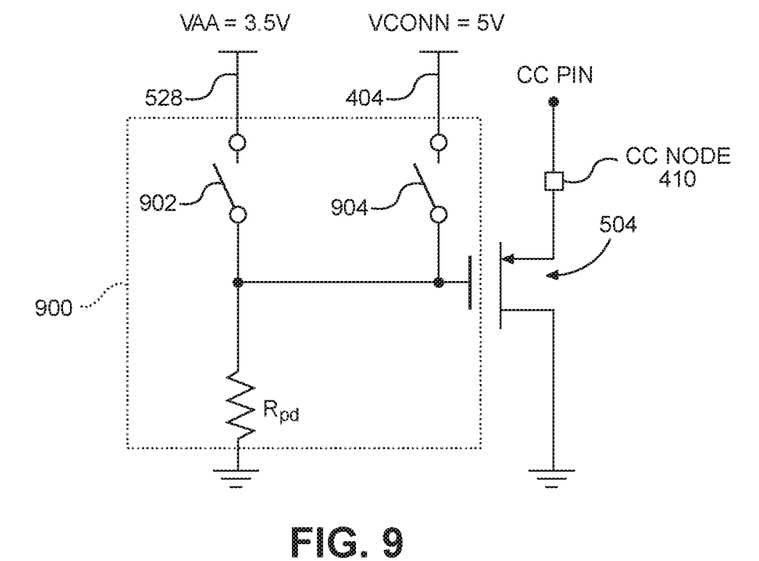
FIG. 9 illustrates a circuit diagram of an alternate biasing circuit with adjustable clamp for a pin in a USB Type-C receptacle.

FIG. 9 provides still another exemplary aspect that allows clamping the voltage at acceptable levels. In this regard, biasing circuitry 900 with the first FET 504 is illustrated. Unlike the biasing circuitry 500 of FIG. 5, the biasing circuitry 900 eliminates the second FET 516 and just switches between the internal voltage source 528 (Vaa) and the external voltage source 404 (Vconn) through switches 902 and 904, respectively. The analog module control system 420 controls the switches 902 and 904, and the method is substantially identical to the process 600 discussed above with reference to FIG. 6. It should be appreciated that the biasing circuitry 900 may be less expensive than the biasing circuitry 500, but may involve further engineering tradeoffs.

The over-voltage protection systems and methods according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
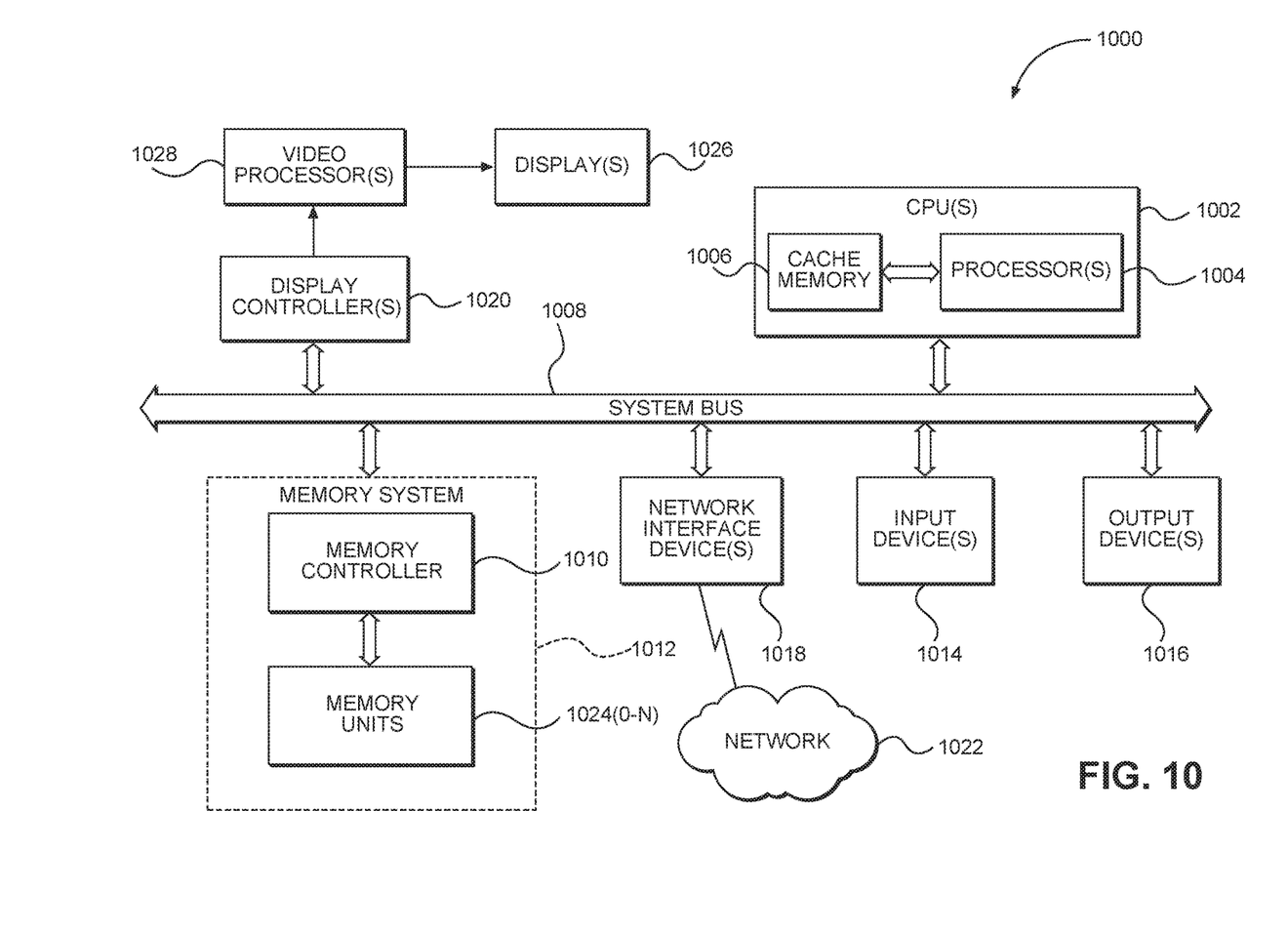
FIG. 10 is a block diagram of an exemplary processor-based system that can include the over-voltage protection biasing circuit of FIG. 5.

In this regard, FIG. 10 illustrates an example of a processor-based system 1000 that can employ a USB receptacle that includes the over-voltage protection system illustrated in FIGS. 4-9. In this example, the processor-based system 1000 includes one or more central processing units (CPUs) 1002, each including one or more processors 1004. The CPU(s) 1002 may have cache memory 1006 coupled to the processor(s) 1004 for rapid access to temporarily stored data. The CPU(s) 1002 is coupled to a system bus 1008 and can intercouple devices included in the processor-based system 1000. As is well known, the CPU(s) 1002 communicates with these other devices by exchanging address, control, and data information over the system bus 1008. For example, the CPU(s) 1002 can communicate bus transaction requests to a memory controller 1010 as an example of a slave device. Although not illustrated in FIG. 9, multiple system buses 1008 could be provided, wherein each system bus 1008 constitutes a different fabric.

Other devices can be connected to the system bus 1008. As illustrated in FIG. 9, these devices can include a memory system 1012, one or more input devices 1014, one or more output devices 1016, one or more network interface devices 1018, and one or more display controllers 1020, as examples. The input device(s) 1014 can include any type of input device, including, but not limited to, input keys, switches, voice processors, etc. The output device(s) 1016 can include any type of output device, including, but not limited to, audio, video, other visual indicators, etc. The network interface device(s) 1018 can be any devices configured to allow exchange of data to and from a network 1022. The network 1022 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1018 can be configured to support any type of communications protocol desired. It should be appreciated that the network 1022 may be connected to another computing device such as the first computing device 102 of FIG. 1 and that the wired network may be the USB cable 106 and, particularly, a USB Type-A to Type-C cable. The memory system 1012 can include one or more memory units 1024(0-N).

The CPU(s) 1002 may also be configured to access the display controller(s) 1020 over the system bus 1008 to control information sent to one or more displays 1026. The display controller(s) 1020 sends information to the display(s) 1026 to be displayed via one or more video processors 1028, which process the information to be displayed into a format suitable for the display(s) 1026. The display(s) 1026 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A device, comprising:
  a Universal Serial Bus (USB) receptacle configured to receive a USB cable, the USB receptacle comprising a configuration control (CC) pin;
  a first field effect transistor (FET) comprising a first source, a first drain, and a first gate, the first source coupled to the CC pin and the first drain coupled to ground;
  a second FET comprising a second source, a second drain, and a second gate, the second gate coupled to the first gate and to the second drain at a communal node;
  a first switch coupled to the second source and selectively coupling the second source to an internal voltage source (Vaa); and
  a second switch coupled to the communal node and selectively coupling the communal node to an external voltage source (Vconn); and
  wherein in a first mode of operation both the first switch and the second switch are open and the CC pin is clamped at a first Vgs above ground and wherein in a second mode of operation only one of the first switch and the second switch is open and the CC pin is clamped at a corresponding first voltage or second voltage.

2. The device of claim 1, wherein the first FET comprises a PMOS FET.

3. The device of claim 1, wherein the second FET comprises a PMOS FET.

4. The device of claim 1, wherein the USB receptacle is a USB Type-C receptacle.

5. The device of claim 1, further comprising a resistor coupled to the second drain and ground.

6. The device of claim 1, wherein Vgs of the first FET comprises a 1.1 volt difference.

7. The device of claim 1, wherein the internal voltage source is approximately 3.5 volts.

8. The device of claim 1, wherein the external voltage source is approximately 5 volts.

9. The device of claim 1, further comprising a control system operably coupled to the first switch and the second switch, the control system configured to open and close the first switch and the second switch.

10. The device of claim 9, wherein the control system is configured to detect a first resistance associated with the CC pin and a second resistance with a second CC pin and, based on the detected resistances, selectively enable the external voltage source.

11. The device of claim 10, wherein the control system is configured to open the first switch if the external voltage source is enabled.

12. The device of claim 10, wherein the control system is configured to open the second switch if the external voltage source is not enabled.

13. The device of claim 1, wherein the first voltage comprises the internal voltage source.

14. The device of claim 1, wherein the second voltage comprises the external voltage source plus Vgs of the first FET.

15. The device of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a server; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

16. A device, comprising:
a Universal Serial Bus (USB) receptacle configured to receive a USB cable, the USB receptacle comprising a configuration control (CC) pin;
a first means for clamping coupled to the CC pin and coupled to ground;
a second means for clamping coupled to the first means for clamping and to a communal node;
a first switch coupled to the second means for clamping and selectively coupling the second means for clamping to an internal voltage source (Vaa); and
a second switch coupled to the communal node and selectively coupling the communal node to an external voltage source (Vconn); and
wherein in a first mode of operation both the first switch and the second switch are open and the CC pin is clamped at a first Vgs above ground and wherein in a second mode of operation only one of the first switch and the second switch is open and the CC pin is clamped at a corresponding first voltage or second voltage.

17. A method for protecting a pin on a Universal Serial Bus (USB) connector, comprising:
providing biasing circuitry on a field effect transistor (FET) associated with a pin on a USB connector;
clamping the pin at a first voltage if power is not applied to a chip associated with the pin by opening two switches of the biasing circuitry to clamp voltage at the pin at the first voltage; and
clamping the pin at one of a second voltage or a third voltage if power is applied.

18. The method of claim 17, further comprising detecting if power is applied to the chip.

19. The method of claim 18, further comprising detecting a resistance associated with the pin.

20. The method of claim 19, further comprising enabling or disabling an external voltage source based on the resistance detected.

21. The method of claim 19, further comprising opening one switch of the two switches in the biasing circuitry based on the resistance detected.

22. The method of claim 18, wherein clamping the pin at one of the second voltage or the third voltage comprises clamping at an internal voltage or at a level associated with an external voltage source.

23. The method of claim 22, wherein clamping the pin at one of the second voltage or the third voltage comprises opening a first of the two switches while closing a second of the two switches to clamp the pin at the second voltage and opening the second of the two switches while closing the first of the two switches to clamp the pin at the third voltage.

24. A device, comprising:
a Universal Serial Bus (USB) receptacle configured to receive a connector of a USB cable, the USB receptacle comprising a configuration control (CC) pin;
a first field effect transistor (FET) comprising a first source, a first drain, and a first gate, the first source coupled to the CC pin and the first drain coupled to ground;
a first switch coupled to the first gate and selectively coupling the first gate to an internal voltage source (Vaa); and
a second switch coupled to the first gate and selectively coupling the first gate to an external voltage source (Vconn); and
wherein in a first mode of operation, both the first switch and the second switch are open and the CC pin is clamped at a first Vgs above ground and wherein in a second mode of operation, only one of the first switch and the second switch is open and the CC pin is clamped at a corresponding first voltage or second voltage.

* * * * *